(12) United States Patent
Tsironis

(10) Patent No.: US 10,001,521 B1
(45) Date of Patent: Jun. 19, 2018

(54) TRANSISTOR TEST FIXTURE WITH INTEGRATED COUPLERS AND METHOD

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 576 days.

(21) Appl. No.: 14/541,622

(22) Filed: Nov. 14, 2014

(51) Int. Cl.
*G01R 31/302* (2006.01)
*G01R 31/26* (2014.01)
*G01R 35/00* (2006.01)
*G01N 22/00* (2006.01)

(52) U.S. Cl.
CPC ......... *G01R 31/2607* (2013.01); *G01N 22/00* (2013.01); *G01R 35/00* (2013.01)

(58) Field of Classification Search
CPC ............ G01R 31/2656; G01R 31/2822; G01R 31/3025
See application file for complete search history.

(56) References Cited

U.S. PATENT DOCUMENTS

| 6,414,563 B1 | 7/2002 | Tsironis |
| 7,282,926 B1 | 10/2007 | Verspecht et al. |
| 7,548,069 B2 * | 6/2009 | Simpson ................. G01R 27/28 324/537 |
| 8,497,689 B1 * | 7/2013 | Tsironis ................. G01R 27/32 324/637 |
| 9,660,641 B2 * | 5/2017 | Green .................. H03K 17/165 |

OTHER PUBLICATIONS

"Test Fixture for Medium and High Power RF Transistors", Product Note 7, Focus Microwaves, Jan. 1994.
Lombardini et al, "Criteria for the Design Loop-type Directional Couplers in the L-Band", IRE transactions on microwave theory and techniques, Oct. 1956, pp. 234 ff.
Stenarson et al., "An In-Circuit Noncontacting Measurement Method for S-Parameters and Power in Planar Circuits", IEEE Transactions on microwave theory and techniques, vol. 49, No. 12, Dec. 2001, p. 2567 ff.

* cited by examiner

*Primary Examiner* — Tung X Nguyen

(57) ABSTRACT

Microwave transistor test fixtures, both micro-strip and coaxial, include integrated wideband directional signal sensors/couplers and allow the detection of the main signal and its harmonic components, injected into and delivered by a transistor in high power operation mode, by using a phase-calibrated network or signal analyzer and allows this way the reproduction of real time signal waveforms. The fixtures are best calibrated using equivalent TRL calibrated fixtures allowing overcoming the incompatibility of the internal ports connecting to the transistor terminals with coaxial cables attached to VNA.

12 Claims, 18 Drawing Sheets

FIG. 6: Prior art a)
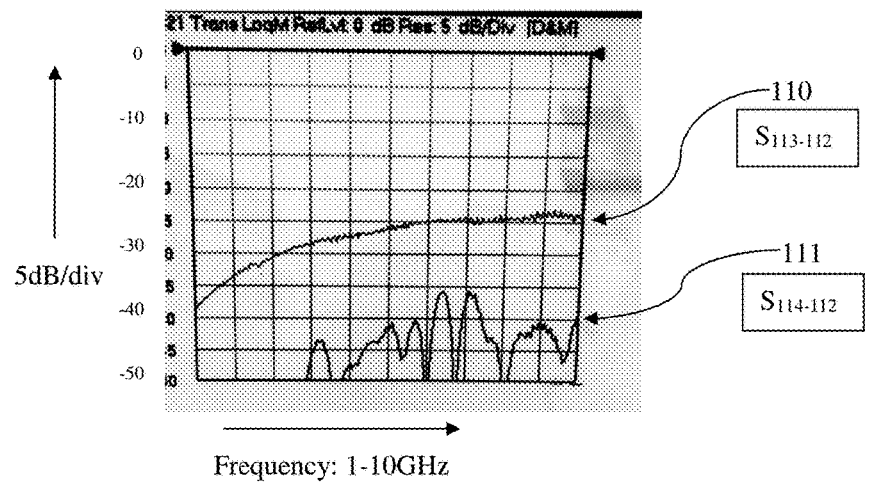
b)
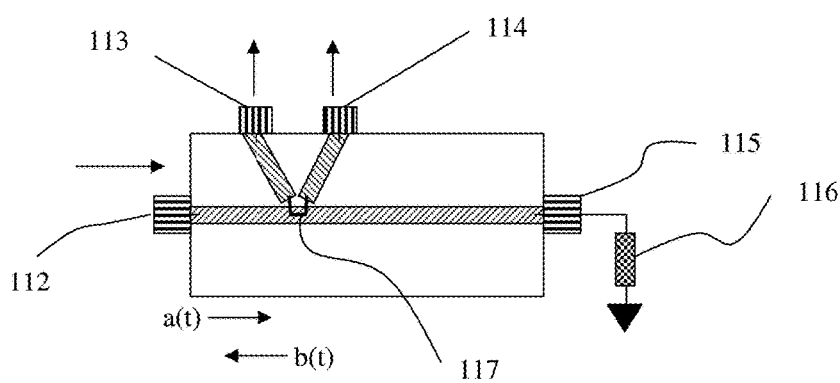
FIG. 11

TRANSISTOR TEST FIXTURE WITH INTEGRATED COUPLERS AND METHOD

PRIORITY CLAIM

Not applicable

CROSS-REFERENCE TO RELATED ARTICLES

1. TSIRONIS, U.S. Pat. No. 6,414,563, "Low-Loss Microwave Device Test Fixture with Adjustable Blocks".
2. "Test Fixture for Medium and High Power RF Transistors", Product Note 7, Focus Microwaves, January 1994.
3. Load Pull; Wikipedia; http://en.wikipedia.org/wiki/Load_pull
4. Fourier Analysis; Wikipedia, http://en.wikipedia.org/wiki/Fourier_series
5. Signal Couplers; http://www.home.agilent.com/upload/cmc_upload/All/Direct_CouplerOverview.pdf?&cc=CA&lc=eng
6. VERSPECHT et al. U.S. Pat. No. 7,282,926, "Method and an Apparatus for Characterizing a High-Frequency Device-Under-Test in a Large Signal Impedance Tuning Environment".
7. LOMBARDINI et al, "Criteria for the Design Loop-type Directional Couplers in the L-Band", IRE transactions on microwave theory and techniques, October 1956, pages 234 ff.
8. STENARSON et al., "An In-Circuit Noncontacting Measurement Method for S-Parameters and Power in Planar Circuits", IEEE Transactions on microwave theory and techniques, Vol. 49, No. 12, December 2001, page 2567 ff.
10. TRL Calibration, http://na.support.keysight.com/pna/help/latest/S3_Cals/TRL_Calibration.htm
11. RADMANESH, Matthew M., "RF & Microwaves Design Essentials", 2007 Author House, Chapter 8, Transmission Matrix, pages 374-376.

BACKGROUND OF THE INVENTION

This invention relates to transistor test fixtures used in testing RF transistors in microwave frequencies (see ref. 1, 2). Active RF components (transistors—DUT) need to be thoroughly tested at the operation frequencies before used in amplifier and other circuit designs. "Load pull" and "Source pull" are test methods which use impedance tuners to systematically characterize the DUTs under various load and source impedance conditions. Load pull or source pull are automated measurement techniques used to measure Gain, Power, Efficiency and other characteristics of the DUT, employing source and load impedance tuners and other test equipment, such as signal sources, directional couplers, test fixtures to house the DUT (device under test, typically an RF transistor) and input and output power meters (FIG. 1), see ref. 3.

At high power the transistors become "non-linear", i.e. input and output signals are not any more directly proportional. A sinusoidal signal at the input is deformed at the output, meaning that it contains "harmonic components". Non-sinusoidal periodical signals in the "time domain" can be described in the "frequency domain" as a Fourier series of the fundamental and harmonic frequency components using a Fourier transformation, see ref. 4 and FIG. 12. An "Inverse" Fourier transformation allows reversing the presentation of the signals from the frequency domain back to the time domain. Most RF instruments operate in the frequency domain, i.e. they process the various frequency components of an incoming signal at their input (test) ports. In order to be able to observe the actual signal waveform at the DUT ports, whereas the measurement occurs at a different position in the network, we must work in the "frequency domain", using the fundamental and harmonic components generated by the Fourier transformation (see ref. 4).

It is obvious that the higher the number of harmonics considered, the more accurate the description of the time behavior of the original signal (FIG. 12) becomes. This means, however that, as the harmonic components traverse the network (most passive networks have "low pass" behavior) higher harmonic components will be attenuated more than lower ones which means that the original signal is "smoothed" out. In other words, the signal form changes as the (non-sinusoidal) signal travels through a passive network such as a transmission line. By cascading ("embedding") the signal harmonic components with the transfer matrix between the measurement point and the DUT will reconstitute the original signal form. However parasitic components, loss and low pass behavior of the network reduce the higher harmonic components significantly (FIG. 14); then reconstitution of the original signal form is affected negatively. This can be seen in FIG. 4: True reconstitution of the original signal form between the measurement reference plane (48) and the DUT port (49) requires very high accuracy both of the measurement at the deferred position (48) and the transfer matrix of the transformation section (415) between the test reference plane (48) and the DUT (49). This is the typical problem in analog telephony and associated distortion of the higher tones in voice or music transmission using long cables between the amplifier and the speakers. Therefore, the closer the actual measurement to the DUT occurs, the easier and more accurate will be the reconstitution of the original signal waveform.

At high frequencies electronic equipment, such as signal and network analyzers, operate in the frequency domain. In the frequency domain it is also easy to shift the reference plane of the measurement. In order to sample the signal's components over a wide frequency range (the more harmonic components are known, the more accurate is the correspondence between the time and frequency domain of a signal) we need wideband signal couplers (see ref. 5). Those couplers can be connected on both sides of the test fixture in which the DUT is mounted (FIGS. 1, 2). However such a setup has insertion loss and signal deformation due to parasitic components of the connectors between couplers and test fixture and transmission lines inside the fixtures and is therefore not an optimum embodiment.

BRIEF DESCRIPTION OF THE DRAWINGS

The invention and its mode of operation will be better understood from the following detailed description when read with the appended drawings in which:

FIG. 11 depicts (a) measured coupling (ports 112 to 113) and isolation (ports 112 to 114) of a signal coupler in a micro-strip fixture shown in a top view (b).

FIG. 15a) depicts the complete fixture; FIG. 15b) depicts a set of fixtures halves used for TRL calibration and FIG. 15c) depicts replacing the left half of the fixture with a TRL calibrated half allowing measurement at the DUT reference plane (1515).

DETAILED DESCRIPTION OF THE INVENTION

Figure 6:
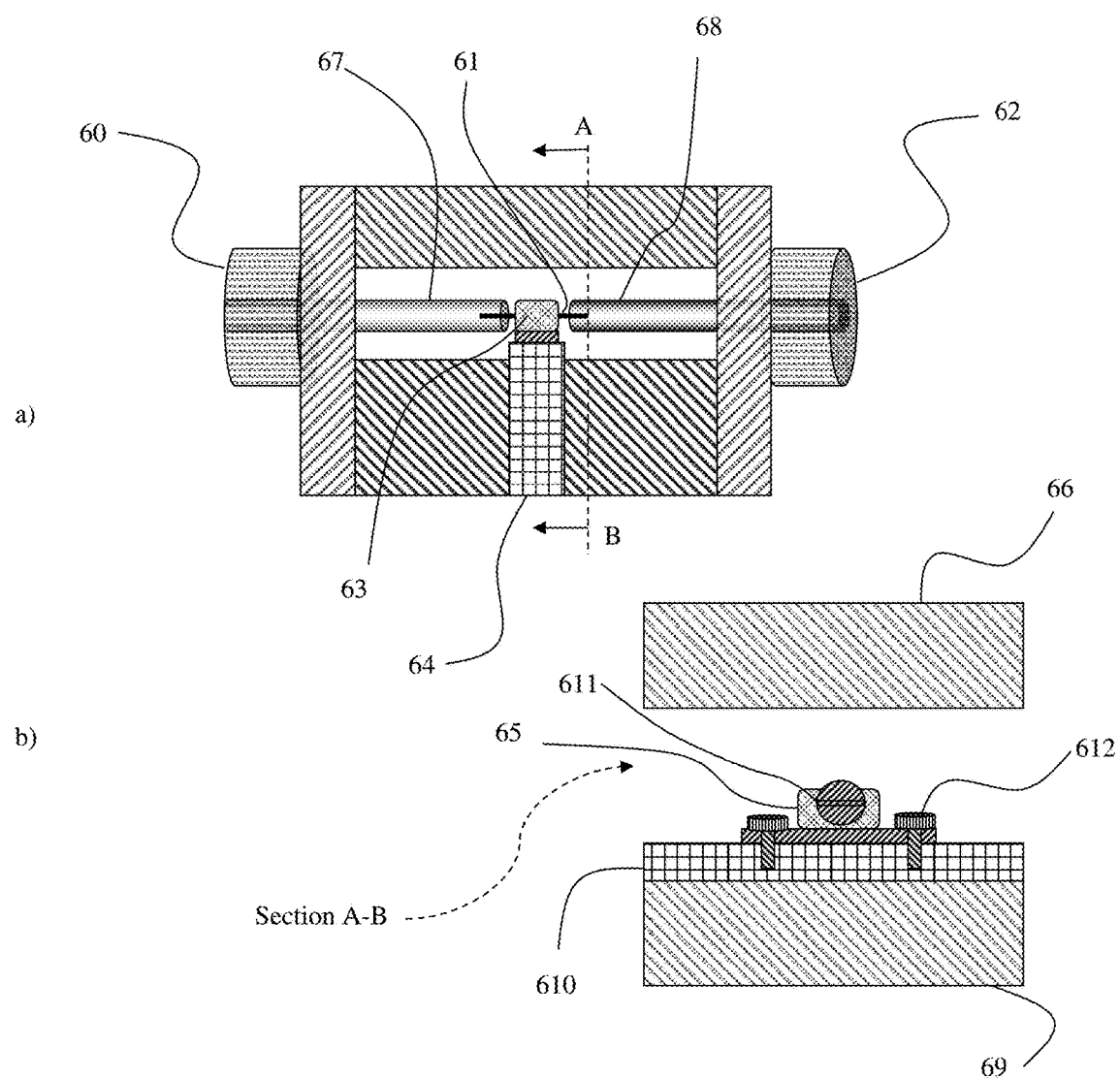
FIG. 6 depicts prior art, side view and cross section of a coaxial transistor test fixture.

Regular transistor test fixtures come in two basic forms: Micro-strip fixtures (FIG. 3) or coaxial fixtures (FIG. 6). Micro-strip fixtures come in form of simple micro-strip (FIG. 3), where there is a continuous ground plane below the micro-strip. All types of test fixtures are being enhanced by adding signal coupling devices as close to the DUT as possible; the directional signal couplers (48, 56, 72, 83, 84, 117, 139) are created either through capacitive (electrical) or inductive (magnetic) field coupling (48, 72) of a set of electrical (84) or magnetic (83) sensors.

Figure 10:
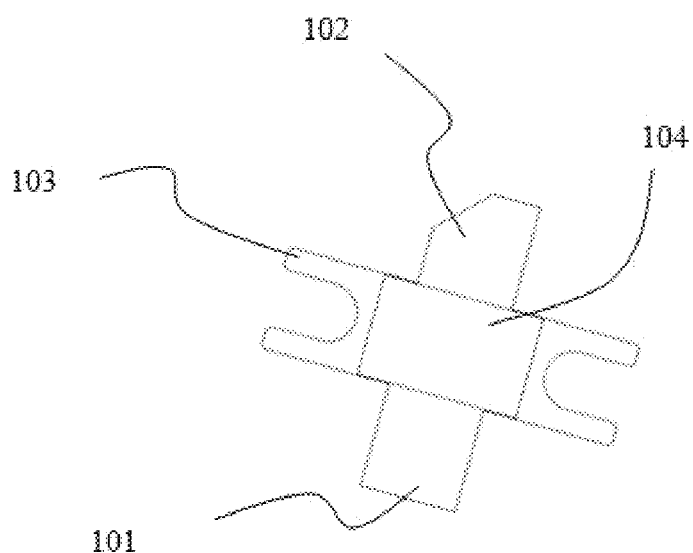
FIG. 10 depicts prior art, a packaged RF power transistor.

A typical micro-strip transistor test fixture (TTF, FIG. 3) comprises two coaxial signal ports, an input port (30) and an output port (37). A dielectric substrate (38) is soldered or mechanically mounted tightly on a metallic block (315) which serves as electrical ground and heat sink for the thermal energy dissipated by the transistor (33). The signal travels on the micro-strip conductor (31) to the input lead of the transistor (34, 102) and from the output lead (101) to the output connector (37). The transistor package (FIG. 10) contains the transistor semiconductor chip inside a ceramic housing (104) and the ground terminal (typically the transistor source) is connected to a metallic support (103) which is mounted tightly with screws (36) on the test fixture insert (35, 314). The insert (314) can be replaced with another one of different size for a different transistor package (FIG. 10).

FIG. 6 shows a coaxial transistor test fixture (see ref. 1). In this case the transistor package (63) is placed on an insert (64) which is part of a horizontal slabline structure made of two ground planes (66, 69, FIG. 6b). The signal enters in the input port (60) and leaves at the output port (62) and is being conducted to the transistor by two coaxial center conductors (67, 68). The transistor leads (61) are inserted into horizontal slots (611) of the center conductors. The test fixture insert (64, 610) holds the transistor package (63, 65) with two screws (612) for good RF grounding and heat dissipation. The advantage of this type of test fixture is lower insertion loss between the transistor leads and the input and output ports.

In a transmission line (FIG. 11b) the signal wave propagating is composed by two power waves: a(t) in forward direction and b(t) in reverse direction. Between a(t) and b(t) and the voltage V(t) between the transmission line and ground and current I(t) flowing through the transmission line there are simple relations:

$$a(t)=(V(t)+Zo\cdot I(t))/2\sqrt{Zo} \text{ and } b(t)=(V(t)-Zo\cdot I(t))/2\sqrt{Zo}. \quad \text{eq } \{1\}$$

Figure 1:
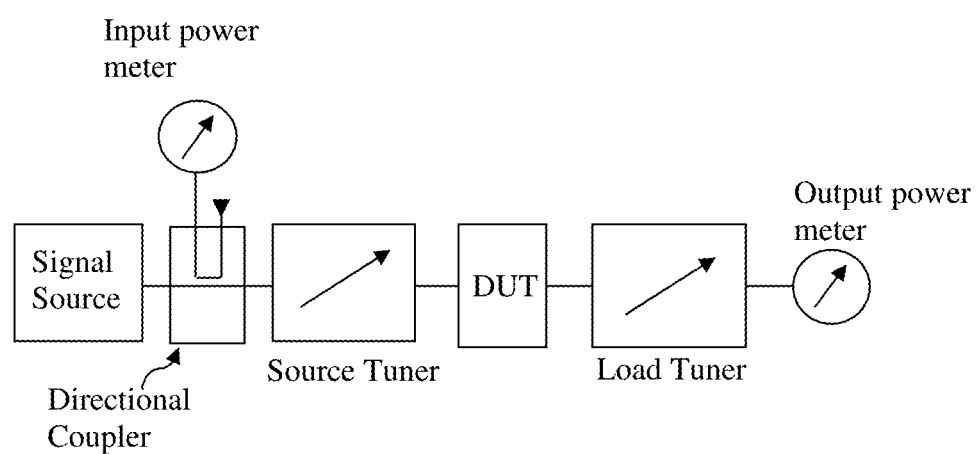
FIG. 1 depicts prior art, a load traditional pull measurement setup.
Figure 2:
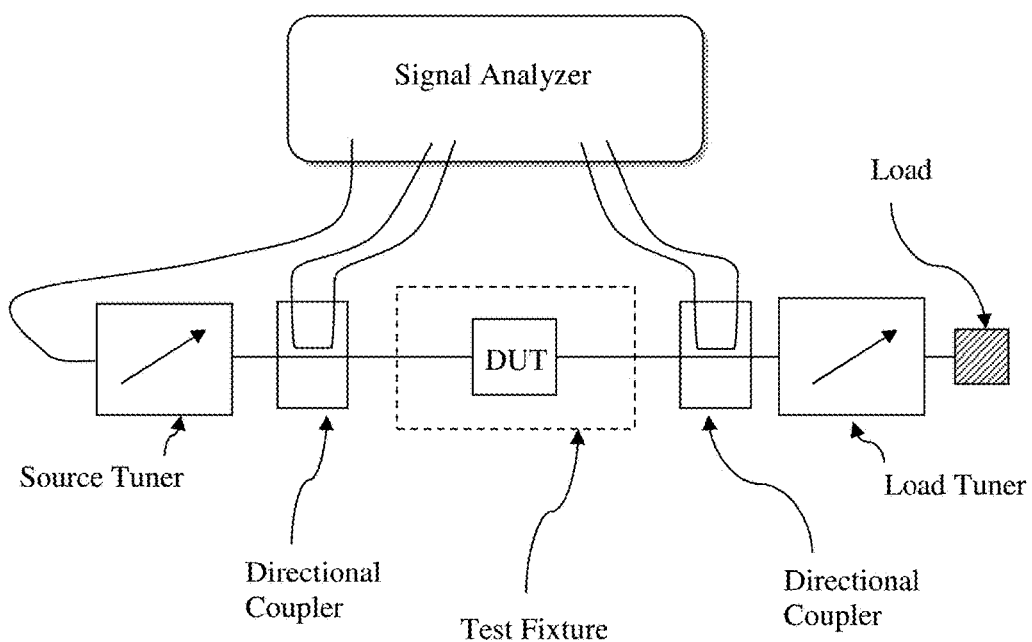
FIG. 2 depicts prior art, a load pull test system with signal waveform detection.
Figure 4:
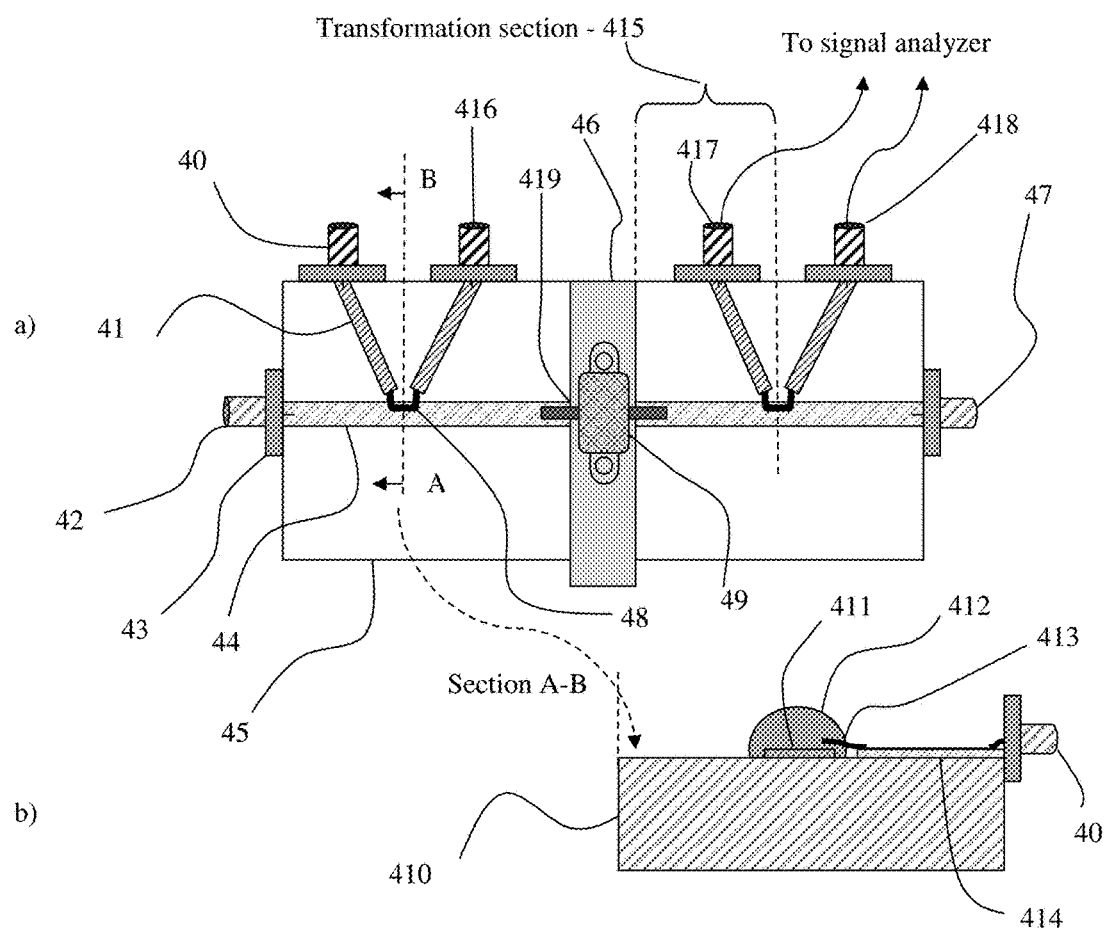
FIG. 4 depicts a micro-strip transistor test fixture with integrated micro-strip wire bridge signal detection couplers fed through micro-strip lines.
Figure 13:
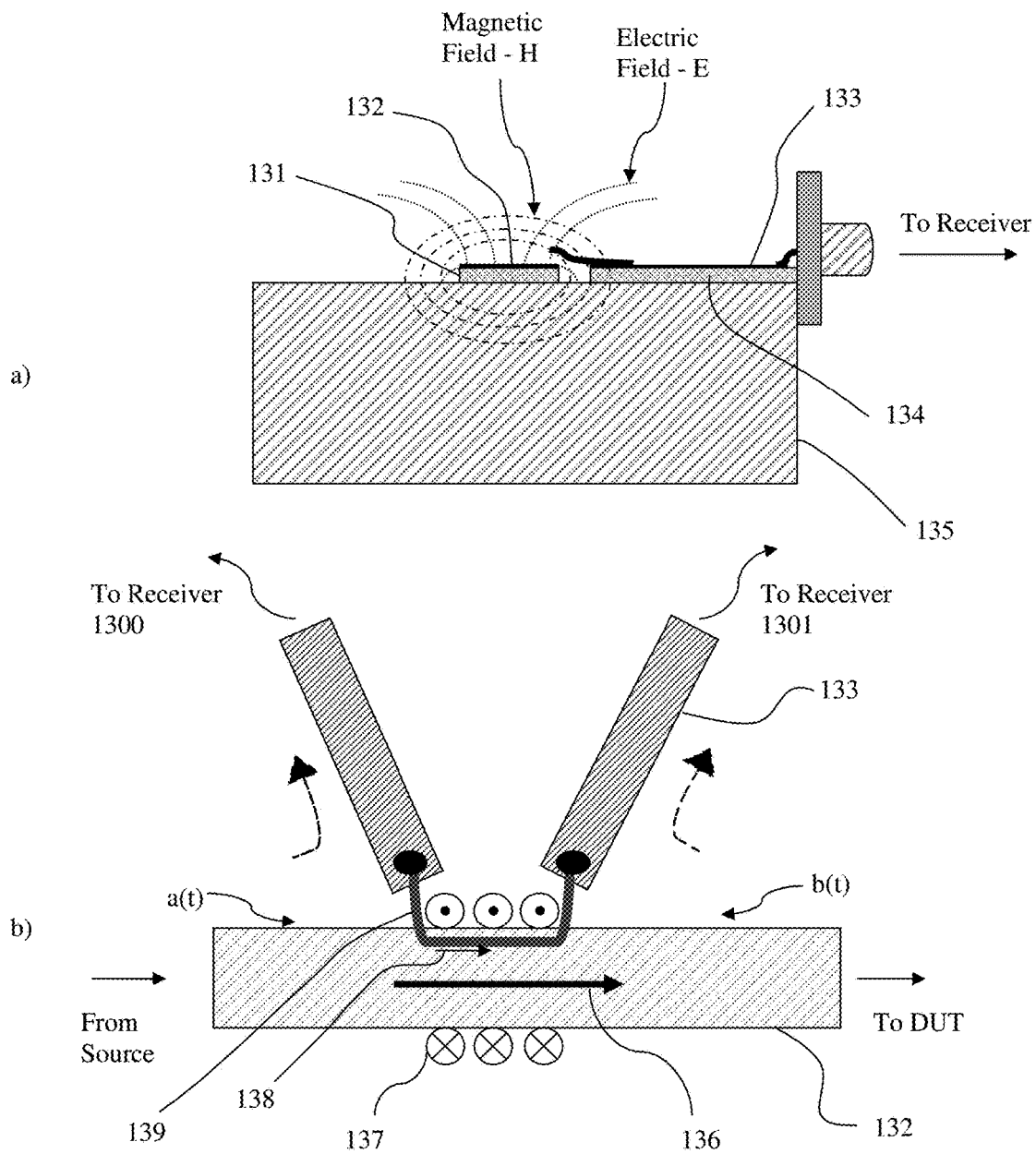
FIG. 13 depicts the electric (E) and magnetic (H) field lines in a wire-bridge signal coupler.

There are a number of configurations allowing a small part of the signal traversing the test fixture to be coupled out (40, 416) and introduced into the signal analyzer (FIGS. 2, 4). As can be seen in FIG. 4a), and the section A-B (FIG. 4b), a micro-strip line (41, 414) connects the coaxial connectors (40, 416) with a conductive wire loop (48, 413), which is placed in non-contacting manner close and partially above the main signal line (44, 411) such as to allow extracting a small part of the signal into the line (414) leading to the signal analyzer through electro-magnetic coupling. The coupling mechanism is demonstrated graphically in FIG. 13: The electrical current (136) flowing inside the conductive micro-strip (132) creates a surrounding magnetic field H (137) which induces a current (138) inside the coupled conductive loop (139). The incident power wave a(t) is predominantly injected into the forward port (1300) of the coupler, whereas the reflected power wave b(t) in predominantly injected into the reverse port (1301) of the coupler. When the coupler is loaded with the characteristic impedance Zo (here 50 Ohms), the ratio between the main signal power a(t) and the signal power at port (1300) is called "coupling factor" and the ratio between the main signal power and the signal power at port (1301) is called "reverse coupling factor" or "isolation". The ratio between the signal powers at ports (1300) and (1301) is called "coupler directivity", FIG. 11a) and is expressed in dB.

FIG. 11 shows measured data of a typical signal coupler, made on a micro-strip test fixture, loaded with a 50 Ohm resistance (116) and using a coupled wire loop (117), see ref. 7, over a frequency range of 1 to 10 GHz. The structure is the same as one half of the fixture in FIG. 4. The signal enters port (112) and exits port (115). Part of the signal is coupled forward to port (113) and another part is "leaked" into port (114). No power is coming back from port (115) since it is loaded with the characteristic impedance of 50 Ohms (116) of the micro-strip line. The coupling factor (110) is shown to vary from −40 dB to −25 dB and the associated reverse coupling factor (111) from below −50 dB to −30 dB. The associated "directivity" varies therefore from >30 dB to 10 dB correspondingly.

The signal couplers can be incorporated in either test fixture structure as shown in FIG. 4, 5, 7, 8 or 9. In the test fixtures of FIGS. 4, 5 and 7 the signal couplers are using wave coupling (see ref. 6 and FIG. 13), whereas in the case of test fixtures of FIGS. 8 and 9 the coupling is by means of an electric and magnetic field sensors. In either case the detected waves a(t), b(t) and voltage V(t) and current I(t) can be converted into each-other using the above equation {1}.

Figure 12:
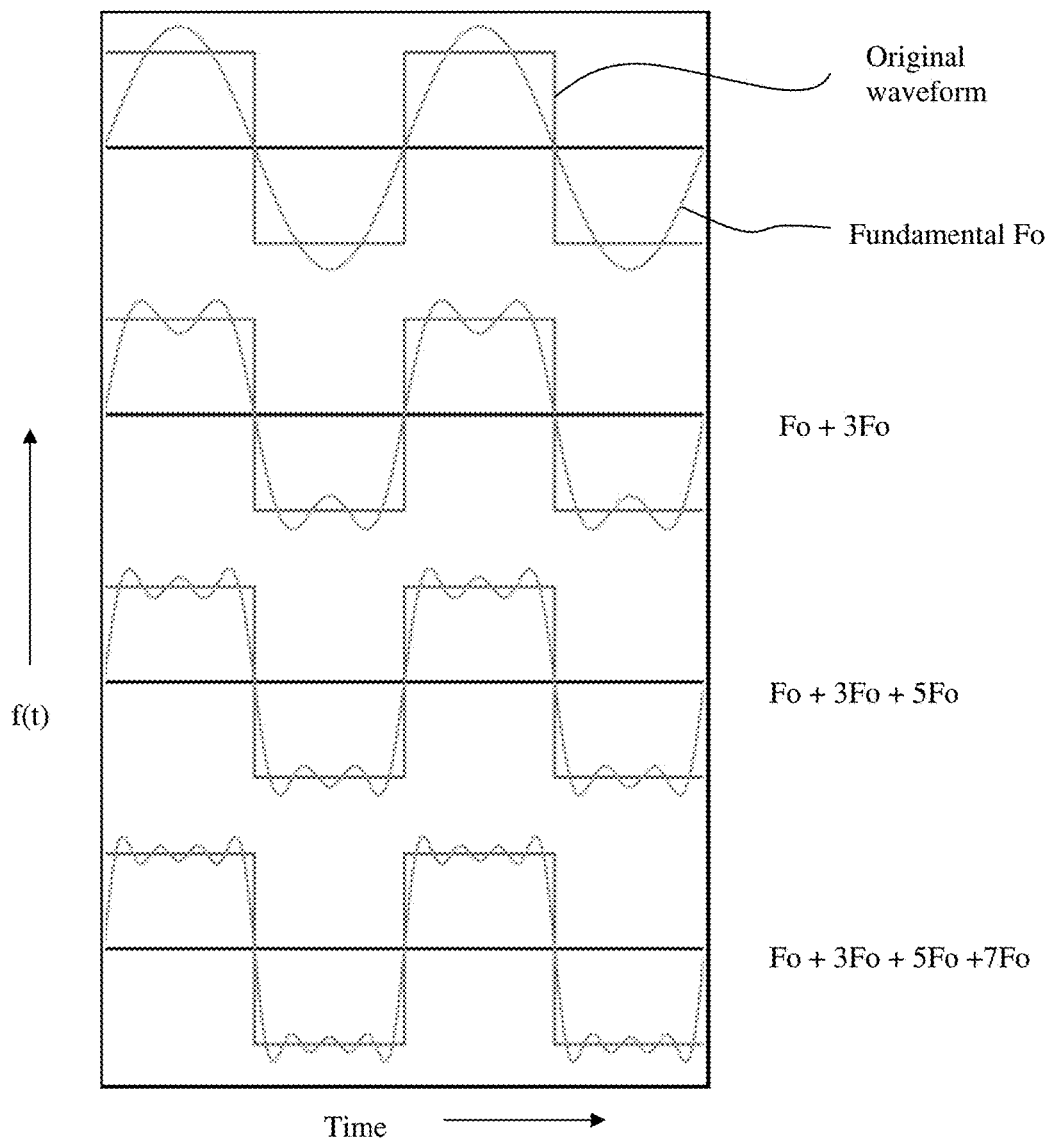
FIG. 12 depicts the approximation of a rectangle waveform f(t) with Fourier series of increasing order.

A micro-strip based test fixture with signal couplers is shown in FIG. 4a) and a cross section thereof in FIG. 4b). The signal entering port (42) travels on the main micro-strip line (44) to the transistor (49) and exits port (47). At the plane A-B a part of the signal energy is electro-magnetically coupled into the loop (48) which is also shown in cross section as (413); the bridge (48) is coupled with the line (44) in a non-contacting relation and feeds into a signal analyzer through ports (40) and (416) for the input section of the test fixture and ports (417) and (418) for the output section. This kind of coupling in micro-strip functions in a similar way as in a coaxial structure (see ref. 6 and FIG. 7), because the electric and magnetic field lines are always distributed similarly around current carrying conductors (FIG. 13a). The data shown in FIG. 11 have been taken with a fixture like the one in FIG. 4. This configuration also shows the advantage of the structure: the transformation section (415) between the signal detection reference and the transistor output port can be kept to a minimum and allows avoiding most parasitic components associated with transmission lines, adapters connectors etc. as shown in FIG. 2, thus allowing detection of the higher harmonic components more accurately and therefore a better reconstruction of the original time waveform using the inverse Fourier transformation (see ref. 5 and FIG. 12).

Figure 3:
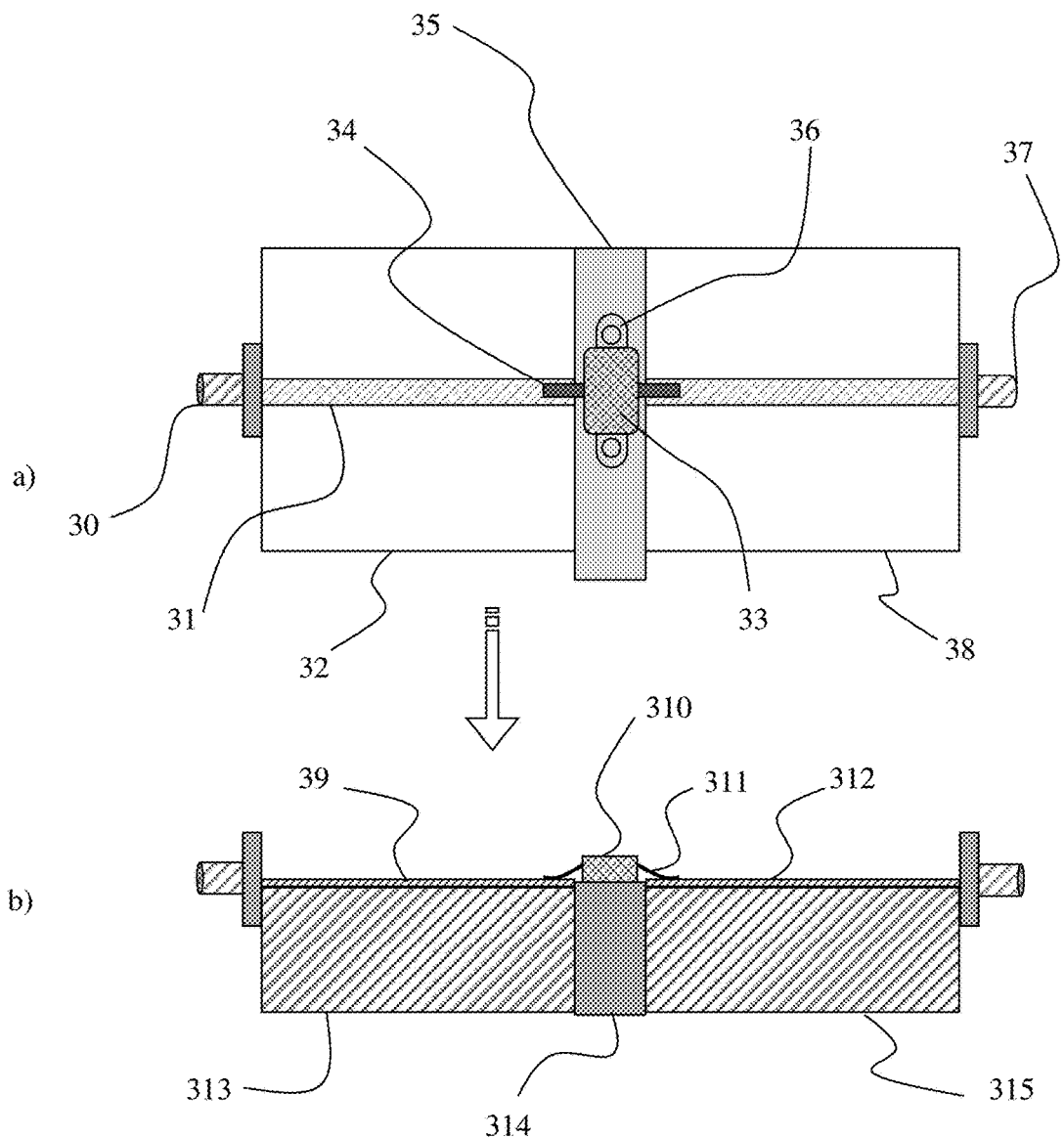
FIG. 3 depicts prior art, top and side views of a micro-strip transistor test fixture.
Figure 5:
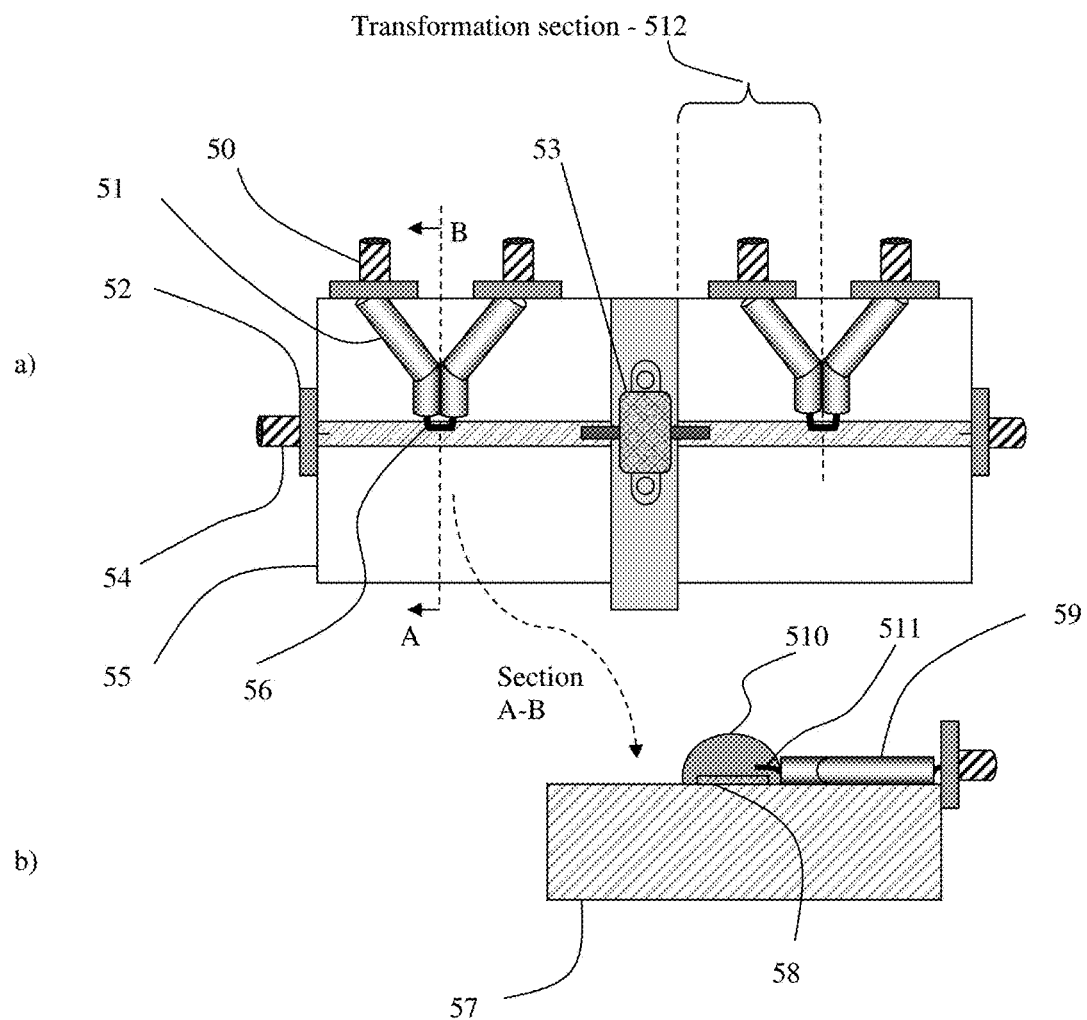
FIG. 5 depicts top and side views of a micro-strip transistor test fixture with integrated signal detection wire bridge couplers fed through coaxial cables.

The micro-strip test fixture in FIG. 3, can be equipped with signal couplers (56) in FIG. 5 made using coaxial (semi-rigid) cable (51) (see ref. 6). The center conductor of the semi-rigid coaxial cable (51) is bent and placed at close proximity (511) with the signal carrying micro-strip (58), FIG. 5b). Insertion loss in the coaxial cable is lower than in the micro-strip structure of FIG. 4 (41, 414) and thus allows lower loss to the main signal for the same signal strength at the signal receiver ports (50). Also, in practical terms, a coaxial cable structure (FIG. 5) can be added to an existing micro-strip test fixture, whereas a micro-strip structure (FIG. 4) must be designed and etched on the dielectric substrate at the time of the manufacturing of the fixture.

Figure 7:
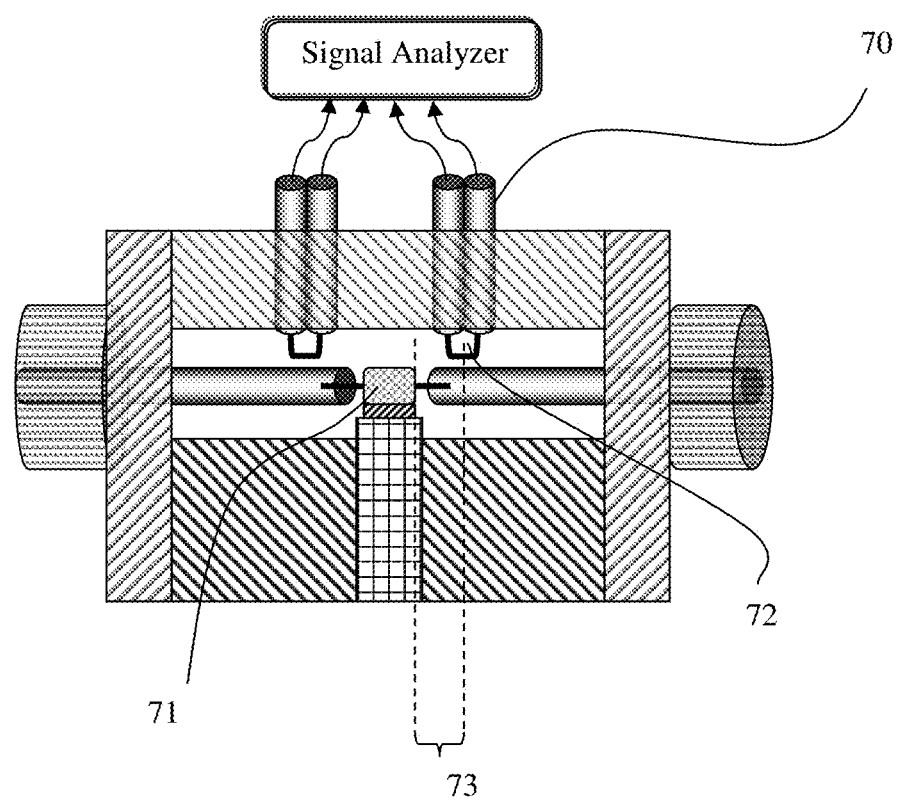
FIG. 7 depicts a coaxial transistor test fixture with integrated wave-probe signal detection couplers.

The coaxial test fixture of FIG. 6, can be enhanced by signal couplers (72) using coaxial cables (70, FIG. 7). The couplers are using an exposed section of center conductor of two coaxial cables, which are attached parallel to each other. The coupling section of center conductor forms a waveprobe (see ref. 6). The exposed center conductor of the coupler is placed parallel to the center conductor of the slabline, in-order to capture a maximum portion of the magnetic field (137) generated around the center conductor (132), FIG. 13. This configuration is as close to the optimum as possible. The insertion loss between coupler (72) and DUT (71) is as low as possible and the harmonic signal detection is as close to reality as possible with very small reference plane corrections (73) needed amounting mainly to a phase correction.

Figure 8:
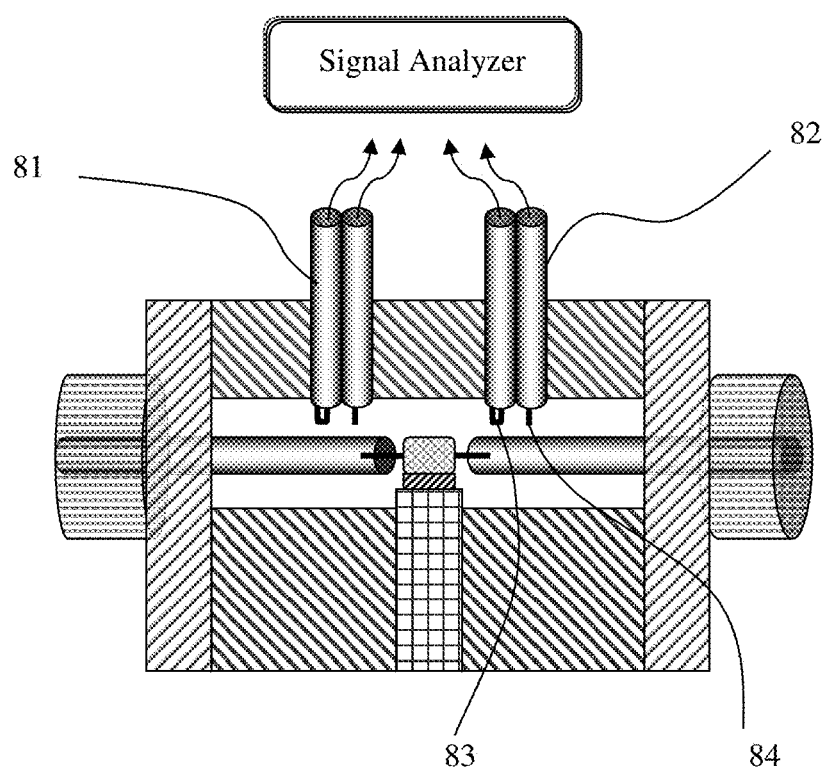
FIG. 8 depicts a coaxial transistor test fixture with integrated voltage and current detection sensors.

The coaxial test fixture of FIG. 6 can be equipped with voltage-current detectors as shown in FIG. 8; the detectors are extensions of the center conductor of coaxial cables (81, 82), see ref. 8; the voltage detector is made as a short antenna extension of the center conductor of the coaxial cable (84), whereas the current detector is made as a magnetic loop of the center conductor bent and connected galvanically (soldered) to the ground mantle of the coaxial cable (83). The current I(t) and voltage V(t) on the transmission line can be expressed as forward a(t) and backward b(t) power waves using equation {1}. The configuration of FIG. 8 shows a traditional, albeit not optimum setting of the voltage and current detectors. It is not optimum since the physical proximity of the sensors affects the isolation between them and also because they cannot be placed at exactly the same electrical distance (phase) of the DUT.

Figure 9:
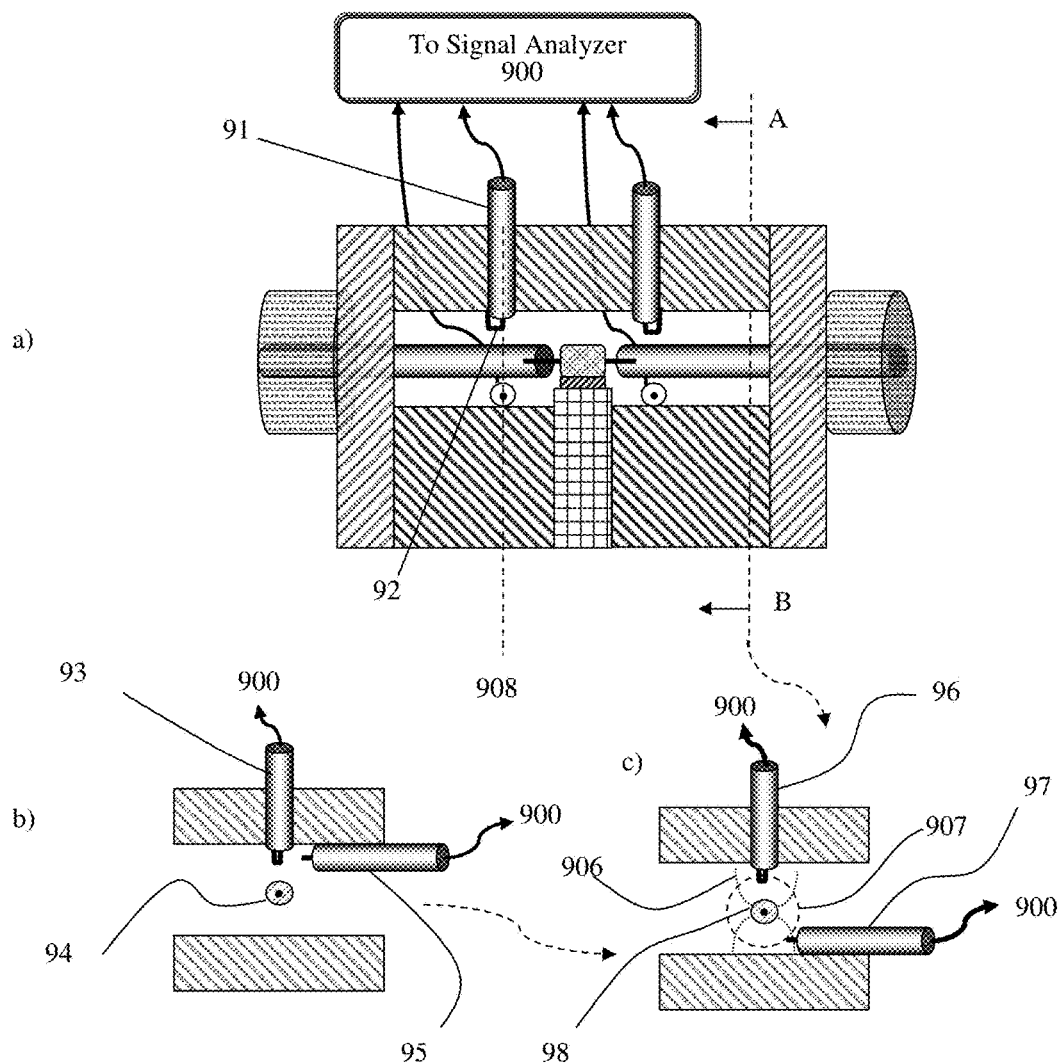
FIG. 9 depicts side and cross section views of two embodiments of a coaxial transistor test fixture with orthogonal current and voltage detection sensors.

FIG. 9 shows improved configurations of a coaxial signal detector set in a coaxial test fixture. As can be seen the voltage and current sensors (92, 904) are placed at the same reference plane/distance from DUT (908) and are orthogonal to each other; in the case of FIG. 9b) the sensors are still close to each-other, so physical separation is not optimum, but in FIG. 9c) this is achieved by placing the voltage sensor (97) at the bottom of the fixture and the current sensor (96) at the top of the fixture, both perpendicularly to the center conductor (98). In all cases the signals (905, 99, 902, 903 and 901) detected by the sensors are being injected into the signal analyzer. In all cases also, the current sensor is made as a magnetic loop, which is parallel to the center conductor of the test fixture in-order to capture the magnetic field H energy (907) and an antenna detector perpendicular to the center conductor in order to capture the electric field E (906), see ref 9.

Figure 14:
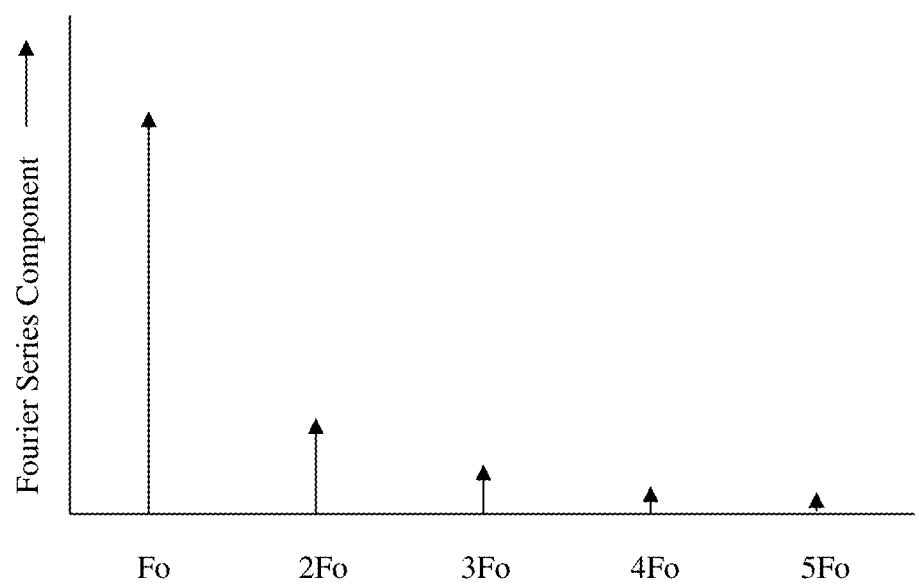
FIG. 14 depicts prior art, the harmonic components created by a transistor in high power operation.
Figure 15:
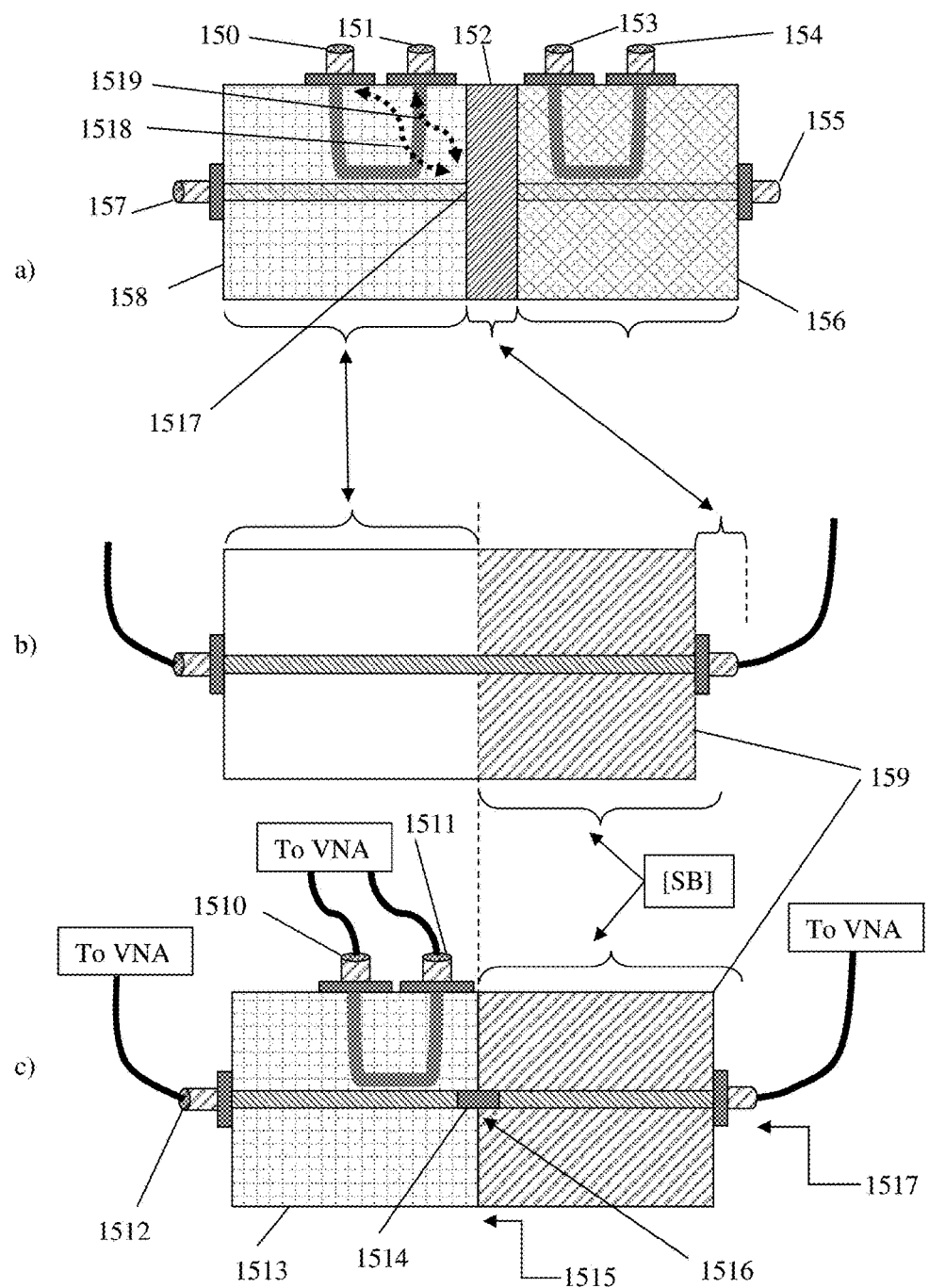
FIG. 15 depicts views of the transistor test fixture (TTF) with integrated couplers for calibration.

In all cases outlined before the actual coupling is increasing with frequency (FIG. 11a). This is an inherent advantage of this kind of signal coupler compared with "flat response" couplers, see ref 5. Increasing coupling with frequency allows sampling a higher portion of the harmonic signal components, which are naturally weaker (FIG. 14), and thus enhances the overall sensitivity of the detection.

Figure 16:
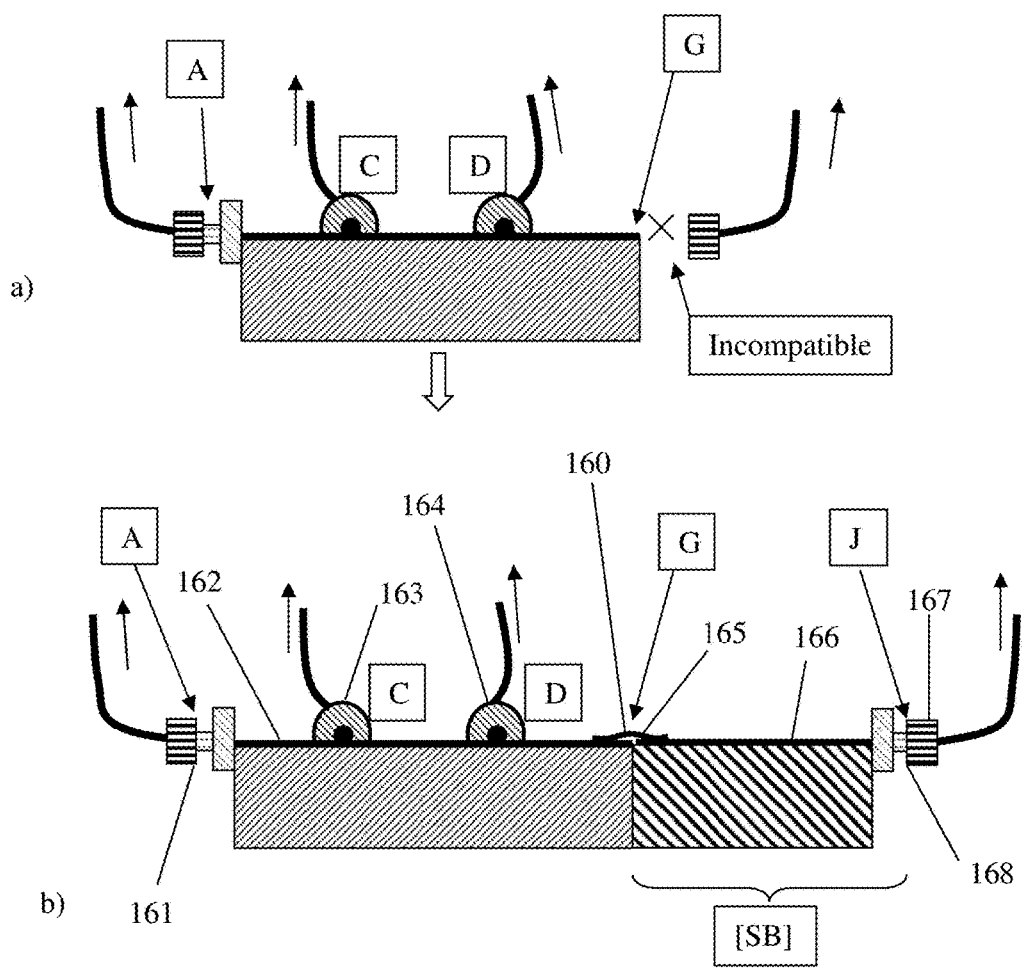
FIG. 16 depicts the denomination of the various external and internal ports of the input section of TTF and output section of ETF and associated de-embedding matrix [SB].
Figure 17:
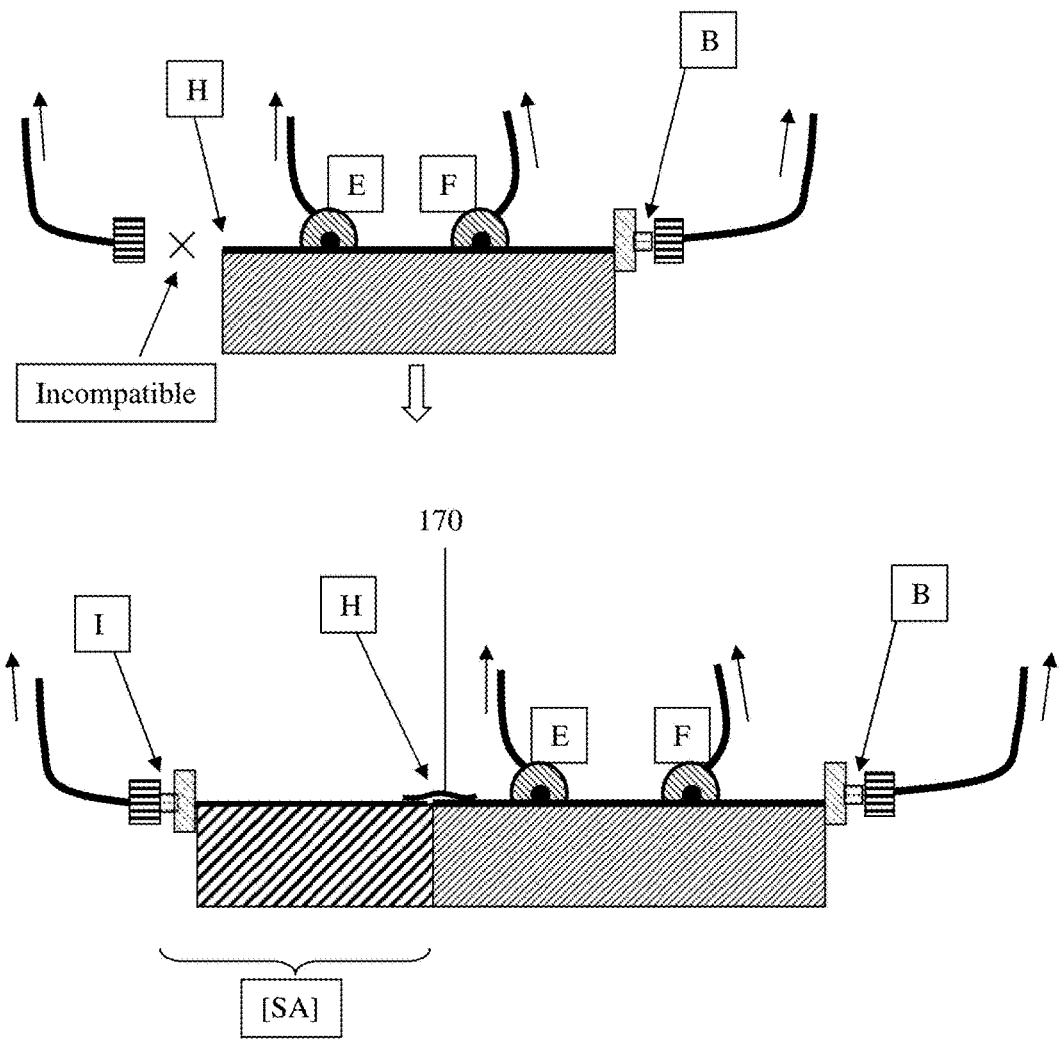
FIG. 17 depicts the denomination of the various external and internal ports of the output section of TTF and input section of ETF and associated de-embedding matrix [SA].
Figure 18:
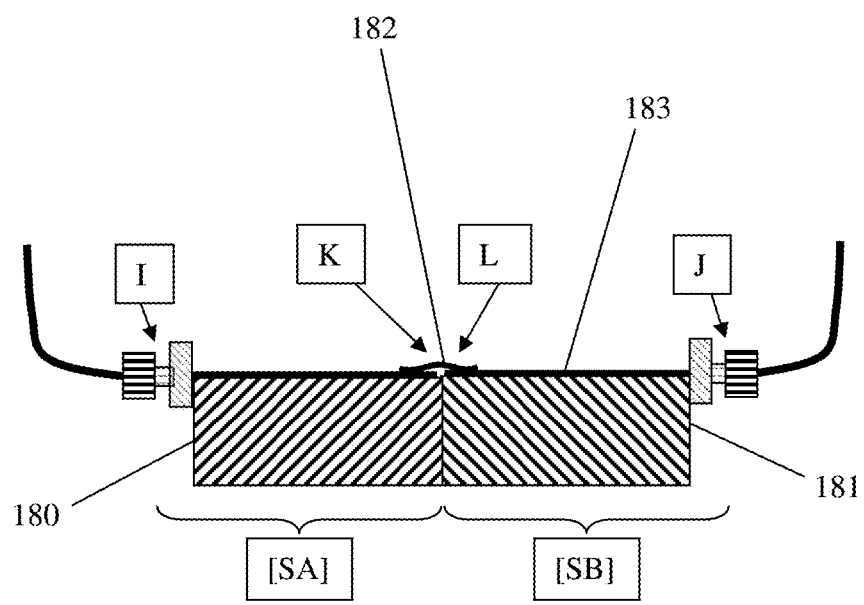
FIG. 18 depicts nomenclature of equivalent test fixture (ETF) halves used for calibration.

As already pointed out, in order to be used the test fixture must be calibrated. This means that the RF parameters (typically scattering or s-parameters) must be known between all ports of the fixture: referring to FIG. 4 these ports are: input port (42), internal port (419), forward coupled port (40) and reverse coupled port (416) for the input section of the fixture and corresponding ports for the output section. Direct measurement of s-parameters between these ports would be possible if it would be possible to attach a coaxial connector at internal port (419). As can be seen, though, in FIG. 16a) it is impossible to attach a calibrated coaxial connector at the internal port G. Even if such a connector could be mechanical attached, it is impossible to calibrate it properly. If such a connector is used at point G, the measured results will be false, because the exact parameters of the connector are unknown. Internal connector (419) or G can only be connected to another microstrip line using a conductive ribbon (160). Thus the calibration must follow another path as follows:

An equivalent test fixture (ETF) is made, as shown in FIG. 18. It comprises two sections which may or may not be identical. Important is that the internal ports K and L of this ETF be compatible with each-other and with the internal ports G and H (FIG. 17) of the original transistor test fixture (TTF). All these internal ports can be connected to each-other, for the purpose of calibration, using conductive (Copper, Brass . . . ) ribbon (182) cut to size to avoid parasitic reflections. The ETF is then calibrated using TRL (see ref. 9). TRL calibration at all frequencies of interest allows determining the s-parameters of the input [SA] and output [SB] sections of ETF. Once [SA] and [SB] are known the ETF is disassembled and each section is connected at the internal ports with the corresponding sections of the fixture TTF. This is shown in FIGS. 16 and 17.

Ribbon (160) is used to join the input section of TTF with the output section of ETF (FIG. 16) and ribbon (170) is used to join the output section of TTF with the input section of ETF (FIG. 17). Once this is done the hybrid fixtures of FIGS. 16 and 17 are accessible at all their ports using coaxial connectors and can be connected to a pre-calibrated vector network analyzer (VNA) to measure s-parameters between all ports. During this measurement all not used ports must be terminated using the characteristic impedance (50 Ohms). The setup in FIG. 16b) allows measuring the transmission between the input port A and internal port G, as well forward and reverse couplings between A and C and A and D. This is implemented as follows: The VNA is calibrated at the ends of the coaxial cable (161) and (168). S-parameters are then measured between ports A and C, between ports J and D and between ports A and J. From these externally measured s-parameters the final data are extracted using de-embedding with the matrix [SB]: s-parameters cannot be multiplied directly; in order to do so s-parameters have to be converted to equivalent transmission parameters (T-parameters), multiplied and converted back to s-parameters, using known relations; this is called hereby "cascading of matrices". Therefore all S-matrices are converted into transmission matrices T: [SA]→[TA], [SAB]→[TAB] etc . . . (see ref. 10). Then [SAG] is extracted using [SAC] de-embedded with [SB] by cascading with the inverse [SB] matrix: $[TAG]=[TAJ]*[TB]^{-1}$; and $[TGD]=[TJD]*[TB]^{-1}$; $[TGC]=[TJC]*[TB]^{-1}$. The coupling coefficients between internal DUT port G and coupled ports C and D: [SGC] and [SGD] provide the information needed: their elements can be calculated as follows:

$$SGC.21=(SAG.22*SAC.21-SB.11*SAC.21)/SAG.21; \quad \text{eq. \{2\}}$$

$$SGD.21=(SAG.22*SAD.21-SB.11*SAD.21)/SAG.21; \quad \text{eq. \{3\}}$$

hereby SAC.21=Real (SAC.21)+j*Imag (SAC.21) and SAD.21=Real (SAD.21)+j*Imag (SAD.21) are complex coupling factors measured directly between ports A and C respectively A and D; "T" stands for T-parameter matrix, "S" stands for s-parameter matrix and the other letters stand for the port name starting with the input port and ending with the output port; as an example: [SAC] means s-parameter matrix from port A to port C and the complex elements of this s-parameter matrix are: [SAC]={SAC.11, SAC.12, SAC.21, SAC.22}, whereby SAC.11 is the reflection factor into port A, SAC.22 the reflection factor into port C, SAC.12 and SAC.21 the forward and reverse voltage gains between ports A and C, when all other ports are terminated using the characteristic impedance. When this is not the case, then corrections must be applied through appropriate calibration (see eq. 2 and 3 above). In all passive reciprocal networks SAC.12=SAC.21. The same convention applies to all hereby used network matrices.

The same methodology is applied to the output section of the test fixture to calculate its coupling parameters between internal DUT port H and coupled ports E and F: SHE.21 and SHF.21 using measured values between ports B and E resp. F and matrix [SA] for de-embedding.

Although the present invention has been explained hereinabove by way of two preferred embodiments, it should be pointed out that other combinations of the described components are possible and, as far as obvious to a person skilled in the art, they shall not limit the scope of the present invention.

What I claim as my invention is:

1. A radio frequency (RF) transistor (device under test, DUT) test fixture comprising test ports and coupled ports in a single housing as follows:
   an input test port and an output test port,
   a main signal transmission line segment connecting said input test port with the input terminal of said DUT and a main signal transmission line segment connecting the output terminal of said DUT with said output test port of said fixture,
   and signal bi-directional coupling section(s), inserted between the terminal(s) of said DUT and the associated test port(s),
   whereby said bi-directional coupling sections comprise a forward coupling port and a reverse coupling port, said coupled ports being operationally connectable with a signal analyzer, which detects the phase and amplitude of the signal waves propagating on said signal transmission lines towards and away from said DUT.

2. The test fixture as in claim 1, in which said main signal transmission lines are microstrip lines and each said signal coupling section comprises a wire bridge between two secondary microstrip lines, each said secondary line leading to an external coaxial connector attached to said fixture, said external coaxial connectors being operationally connectable with the said signal analyzer, and whereby said wire bridge is placed, in a non-contacting relation, in the immediate proximity of the said signal transmission line.

3. The test fixture as in claim 1, in which said main signal transmission line is a microstrip line and each said signal coupler comprises a wire bridge between the center conductors of two coaxial cables, each said coaxial cable leading to an
   external coaxial connector attached to said fixture,
   said external coaxial connectors being operationally connectable with the said signal analyzer,
   said wire bridge being placed, in a non-contacting relation, in the immediate proximity of the main signal transmission line.

4. The fixture as in claim 2 or 3,
   whereby said wire bridge overlaps, in a non-contacting manner, with the signal transmission line.

5. The test fixture as in claim 1, in which said main signal transmission line is a microstrip line and each said signal coupling section comprises a conductive microstrip section between two secondary microstrip lines leading to coaxial connectors attached to said fixture,
   said connectors being operationally connectable with the said signal analyzer; and whereby said conductive microstrip section is placed in a non-contacting relation in the immediate proximity, approximately parallel, to the said main signal transmission line.

6. A radio frequency (RF) test fixture comprising two test ports, an input test port and an output test port,
   a main signal transmission line segment connecting said input test port with the input terminal of the device under test (DUT) and a main signal transmission line segment connecting the output terminal of said DUT with said output test port of said fixture and at least one signal bi-directional coupling section inserted between said DUT terminals and said fixture test ports in the same housing,
   whereby said input and output segments are slablines comprising two parallel conductive plates and a center conductor,
   and whereby said bi-directional signal coupling section(s) comprise electric and magnetic field sensors allowing measuring amplitude and phase of the signal waves, said sensors being placed between the DUT terminals and the test ports, said sensors being operationally connectable to a signal analyzer.

7. The test fixture as in claim 6,
   whereby said signal coupling sections are wave-probes, said wave-probes comprising a short section of exposed center conductor forming a bridge between the center conductors of two joined coaxial cables, said exposed center conductor section being placed, in a non-contacting manner, close to the center conductor of said input and output slabline sections parallel to said center conductor, said coaxial cables being operationally connected to a signal analyzer.

8. The test fixture as in claim 6, in which said electric and magnetic field sensors are placed next to each other and perpendicular to the center conductor.

9. The test fixture as in claim 6, in which said electric and magnetic field sensors are placed perpendicular to each-other, the magnetic field sensor being placed parallel to the sidewall and perpendicular to the center conductor and the electric field sensor being inserted through a hole in the sidewall perpendicular to and in the proximity of the center conductor of said slabline.

10. The test fixture as in claim 2 or 3 or 5 or 6 or 7 or 8 or 9, in which the characteristic impedance Zo of said transmission lines is 50 Ohm.

11. The test fixture as in claim 2 or 3 or 5 or 6 or 7 or 8 or 9, in which the characteristic impedance Zo of any said transmission line, is different than 50 Ohm.

12. A calibration method for radio frequency (RF) transistor test fixtures (TTF), whereby said fixtures comprise distinct input and output sections and directional coupling sections associated with both input and output sections, said fixtures having input port A and output port B;

and input coupled ports C and D and output coupled ports E and F;

and internal ports G and H connecting to the DUT, whereby port G connects to the input DUT terminal and port H to the output DUT terminal, said calibration method comprising the following steps:

a) an equivalent RF test fixture (ETF) having an input port I and output port J, and two distinct sections, an input and an output section, said input section having a coaxial port I and an internal port K and said output section having an internal port L and a coaxial port J, said ports being connected to each-other using transmission lines;

and using coaxial connectors at ports I and J, said fixture ETF is calibrated using standard TRL method on a pre-calibrated vector network analyzer, hereby extracting s-parameter matrices for said input and output sections of said ETF;

b) s-parameters of said input and output sections of said ETF are saved as matrices [SA] and [SB] correspondingly;

c) the input and output sections of TTF and ETF are separated;

d) the input section of TTF is connected at internal port G with internal port L of the output section of said ETF and s-parameters are measured between ports A and J as well between ports J and C and J and D and saved;

e) s-parameters measured in step d) are de-embedded (cascaded using the inverse matrix [SB]) and saved;

f) the output section of TTF is connected at internal port H with internal port K of the input section of said ETF and s-parameters are measured between ports I and B as well between ports I and E and I and F and saved;

g) s-parameters measured in step f) are de-embedded (cascaded using the inverse matrix [SA]) and saved.

* * * * *